(12) United States Patent
Murade

(10) Patent No.: US 6,838,697 B2
(45) Date of Patent: Jan. 4, 2005

(54) ELECTRO-OPTICAL DEVICE AND ELECTRONIC EQUIPMENT

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/355,026

(22) Filed: Jan. 31, 2003

(65) Prior Publication Data

US 2003/0155588 A1 Aug. 21, 2003

(30) Foreign Application Priority Data

Feb. 12, 2002 (JP) ........................................ 2002-034697
Nov. 20, 2002 (JP) ........................................ 2002-336525

(51) Int. Cl.[7] ............................................. H01L 31/036
(52) U.S. Cl. ............................................ 257/59; 257/98
(58) Field of Search ............................. 257/59, 98, 347

(56) References Cited

U.S. PATENT DOCUMENTS 6,489,631 B2 * 12/2002 Young et al. ................. 257/59
6,583,830 B2 * 6/2003 Yasukawa et al. ............. 349/43
6,661,025 B2 * 12/2003 Hirabayashi .................. 257/53

* cited by examiner

*Primary Examiner*—Allan R. Wilson
(74) *Attorney, Agent, or Firm*—Oliff & Berridge, PLC

(57) ABSTRACT

A substrate is overlaid with each pixel electrode and a TFT connected thereto, each scanning line and each data line which are connected to the TFT, each pixel potential side capacitance electrode which is connected to the pixel electrode and which constitutes a storage capacitor, each fixed potential side capacitance electrode which is arranged in opposition to the pixel potential side capacitance electrode via a dielectric film and which constitutes the storage capacitor, and a contact hole which electrically connects the fixed potential side capacitance electrode and a lower light shield film disposed under the TFT so as to shield the TFT from the entrance of light. Thus, in an electro-optical device having the TFT, crosstalk, burn-in ascribable to the narrowing of the storage capacitor are prevented or substantially prevented from occurring, and also a light leakage current in the TFT is prevented or substantially prevented from being generated.

19 Claims, 8 Drawing Sheets

ELECTRO-OPTICAL DEVICE AND ELECTRONIC EQUIPMENT

BACKGROUND OF THE INVENTION

1. Field of Invention

The present invention relates to an electro-optical device, such as liquid crystal device, of an active-matrix drive scheme, and an electronic equipment including the electro-optical device.

2. Description of Related Art

A related art electro-optical device includes a pair of substrates between which an electro-optical substance, such as liquid crystal, is sandwiched, and electrodes which are respectively provided in the pair of substrates in order to apply electric fields to the electro-optical substance. The electrodes are utilized to apply the electric fields to the electro-optical substance, to thereby properly change the state of this electro-optical substance. According to such an electro-optical device, light emitted from a light source by way of example is entered into the device, and the state of the electro-optical substance is properly changed as explained above, whereby the transmission factor of the light can be controlled so as to display an image.

A related art type of such an electro-optical device is capable of what is referred to as "active-matrix drive" by including pixel electrodes which are arrayed in the shape of a matrix as the above electrodes in one of the pair of substrates, and also including thin film transistors (hereinafter "TFTs") which are connected to the respective pixel electrodes, as well as scanning lines and data lines which are connected to the respective TFTs and which are respectively laid in parallel with row and column directions. Thus, the application of a voltage to the electro-optical substance can be controlled for each individual pixel which is defined by the pixel electrode and the scanning line as well as the data line.

Further, in the electro-optical device, various constituents other than those mentioned above are usually included in order to display an image of higher quality. A typical example is each storage capacitor which includes a pixel potential side capacitance electrode connected to the corresponding pixel electrode and TFT, and a fixed potential side capacitance electrode arranged in opposition to the pixel potential side capacitance electrode via a dielectric film. The storage capacitor is utilized to retain the voltage applied to the electro-optical substance, for a predetermined time period.

SUMMARY OF THE INVENTION

The related art electro-optical device, however, is subject to a problem as stated below. Regarding the electro-optical device as stated above, for the purpose of displaying a brighter image, it is generally desired to enhance an aperture efficiency in such a way that an area which is occupied on the substrate by the scanning line and the data line, or the storage capacitor or the like is made smaller to enlarge a light transmission area from which light actually contributing to the image display in each pixel exits by transmission or reflection. The "aperture efficiency" signifies the ratio of the light transmission area as occupied in the whole region of one pixel. In addition, for the purposes of saving power, a request is simultaneously made to heighten the precision or reducing the size of the electro-optical device. The various constituents mentioned above should be small or minute, to satisfy a general demand of addressing the above issues.

It is particularly problematic here that the storage capacitor must be narrowed. When such narrowing is achieved in such a way that the electrodes constituting the storage capacitor are formed so as to have a smaller width, the resistances of the respective electrodes are heightened, and crosstalk, burn-in are incurred in a worst case. In the related art, the pixel potential side capacitance electrode constituting the storage capacitor is formed of polysilicon or tungsten silicide (WSi) as a common example. Since, however, such a material is never low in resistance, the above problem is more serious.

In making the various constituents minute and narrow as stated above, close attention must also be paid to the entrance of light into the TFT. The reason is that, when light enters the channel region of a semiconductor layer constituting the TFT, a light leakage current is generated to cause flickering on an image, so the quality of the image is lowered. Especially in a case where the electro-optical device is utilized as a light valve in a projection type display device, and light emitted from a very intense light source is usually entered into the light valve, there may be a problem particularly as the light is more likely to enter the TFT.

In the related art, in order to reduce or prevent such light entrance into the TFT, there has been adopted an expedient where a light shield layer is disposed on that one of the two substrates which is not provided with the TFT. With such an expedient, however, the distance between the light shield layer and the TFT becomes comparatively large, resulting in the problem that an effective light-shielding function cannot be expected for light entering the TFT obliquely. In order to address this problem, it can be considered to provide the light shield layer with a large width. In this case, however, the aperture efficiency lowers, and it is impossible or nearly impossible to comply with the general demand or problem stated above.

In addition to the above expedient, the expedient of utilizing the data line as a light shield layer can be used to prevent or substantially prevent the light entrance into the TFT. This expedient, however, is subject to the problem that, while the data line is usually made of a material of low resistivity, for example, aluminum, in order to lower the loss of signal transmission to the utmost, the material exhibits a high light reflectivity. More specifically, according to such an expedient, although light which directly enters the entrance side surface of the data line can be intercepted, light reflected from the data line may become stray light, or light may be reflected from the other surface of the data line to become stray light, whereby the stray light leads to the TFT ultimately.

Even in such an expedient, enlargement in the width of the data line with the intention of enhancing the light-shielding function incurs the problem of lowering the aperture efficiency, likewise to the foregoing light shield layer. Moreover, in view of the above problem of the stray light, the enlarged width of the data line increases the quantity of the stray light on the contrary, and may produce a rather adverse effect for the prevention of the generation of the light leakage current.

The present invention addresses the above and/or other problems, and provides an electro-optical device which can comply with general demands, such as the enhancement of an aperture efficiency, while preventing or substantially preventing the occurrence of crosstalk, burn-in or the like ascribable to the narrowing of a storage capacitor, and also preventing or substantially preventing the generation of a light leakage current in a TFT. The invention also provides an electronic equipment which includes the electro-optical device.

An exemplary embodiment of the electro-optical device of the present invention includes, over a substrate, a scanning line; a data line; a thin film transistor which is disposed in correspondence with an intersection between the scanning line and the data line; a pixel electrode which is disposed in correspondence with the thin film transistor; a pixel potential side capacitance electrode which is electrically connected to the pixel electrode, and which constitutes a storage capacitor; a fixed potential side capacitance electrode which is arranged in opposition to the pixel potential side capacitance electrode via a dielectric film, and which constitutes the storage capacitor; and a lower light shield film which is disposed under the thin film transistor, and which shields, at least a channel region of the thin film transistor from entrance of light. The lower light shield film and the fixed potential side capacitance electrode are electrically connected. The lower light shield film constructs, at least part of a capacitive line for keeping the fixed potential side capacitance electrode at a fixed potential, or a redundant wiring line of the capacitive line.

According to the electro-optical device of the present invention, scanning signals and image signals are fed to the thin film transistors via the scanning lines and the data lines, whereby the pixel electrodes can be driven by active matrix drive. The storage capacitor, in which the pixel potential side capacitance electrode and the fixed potential side capacitance electrode are arranged in opposition to each other, is connected to each pixel electrode, so that the voltage of the image signal written into the pixel electrode can be retained for a long time period.

The thin film transistor is underlaid with the lower light shield film which intercepts light from entering the thin film transistor, whereby the entrance of light into a semiconductor layer constituting the thin film transistor, particularly into the channel region of the transistor, is prevented or substantially prevented from occurring, so that the generation of a light leakage current can be prevented to the utmost or substantially prevented.

Especially in the present invention, the lower light shield film and the fixed potential side capacitance electrode are electrically connected, and the lower light shield film constructs, at least part of the capacitive line to keep the fixed potential side capacitance electrode at the fixed potential, or the redundant wiring line of the capacitive line, whereby the capacitive line is not heightened in resistance. The reason is that, due to the electrical connection between the lower light shield film and the fixed potential side capacitance electrode, the lower light shield film is also permitted to function as the fixed potential side capacitance electrode or the capacitive line. That is, according to the present invention, even in such a case where the capacitive line has damaged due to cracking or the like, the lower light shield film can continue to fulfill its function as the capacitive line, and hence, the likelihood of hindrance to the operation of the whole device can be lowered.

In the expression of the "capacitive line to keep the fixed potential side capacitance electrode at the fixed potential", the "fixed potential side capacitance electrode" may construct part of the "capacitive line", or it may well be considered as a connection portion extended from the "capacitive line".

Such facts apply better especially in a case where a material for the capacitive line is a layer which is made of a metal element, an alloy, a metal silicide or a poly-silicide containing at least one of the refractory metals used traditionally, for example, Pt (platinum), Ru (ruthenium), Ti (titanium), Cr (chromium), W (tungsten), Ta (tantalum) and Mo (molybdenum), or stacked layers including the above layers. In such a case, accordingly, the functional effects of the present invention are achieved more efficiently. The reason is that, in the case of utilizing any of the various materials mentioned above, a contractive force or a compressive force, which acts inside the capacitive line, becomes comparatively great.

However, in a case where the electro-optical device according to the present invention is manufactured by a low-temperature process, the capacitive line may well be formed of aluminum (Al).

The present invention is clearly advantageous for narrowing the capacitive line, namely, narrowing the storage capacitor, and thereby realizing enhancement in an aperture efficiency, or the higher definition of the electro-optical device. The reason is that, even if the capacitive line is narrowed, the lower light shield film conjointly fulfills its function as the capacitive line, so the resistance of the capacitive line is not heightened. Conversely speaking, it is meant that, according to the present invention, the enhancement of the aperture efficiency or the higher definition of the electro-optical device can be easily achieved. Moreover, it is consequently permitted to prevent or substantially prevent the occurrences of crosstalk, burn-in ascribable to the heightened resistance of the capacitive line as have hitherto been problematic.

Further, according to the present invention, the lower light shield film and the capacitive line including the fixed potential side capacitance electrode are in the redundant relationship as stated above, so that the reliability of the whole device can be enhanced.

In addition, in the present invention, as stated above, the lower light shield film has both the action which prevents light from entering the thin film transistor, and the action which replaces the function held by the fixed potential side capacitance electrode. Therefore, the present invention can attain also such effects as reducing manufacturing cost or enhancing the reliability of the device, in correspondence with the avoidance of such a construction that one member is disposed for the action of preventing or substantially preventing the light entrance into the thin film transistor, while another member is disposed for the replacing action.

In one aspect of the electro-optical device of the present invention, the lower light shield film and the fixed potential side capacitance electrode are electrically connected by a first contact hole which is provided in an inter-layer insulating film existing between the lower light shield film and the fixed potential side capacitance electrode.

According to this aspect, the electrical connection between the lower light shield film and the fixed potential side capacitance electrode can be achieved comparatively easily.

In this aspect, the first contact hole should preferably be arranged under the data line.

According to such a construction, the first contact hole lies under the data line, so that the aperture efficiency can be enhanced. More specifically, generally in the electro-optical device constructed as stated above, the data line becomes a member which defines a non-open region. According to the provision of the first contact hole in such a non-open region, the situation of the new increase of the non-open region is not incurred. It is consequently permitted to attain the enhancement of the aperture efficiency, in spite of the provision of the first contact hole.

In another aspect of the electro-optical device of the present invention, at least either the fixed potential side capacitance electrode or the lower light shield film is formed to be insular on the substrate.

According to this aspect, with the fixed potential side capacitance electrodes taken as an example more concretely, in a case where the plurality of pixel electrodes exist in the shape of a matrix, the fixed potential side capacitance electrodes being insular exist in units of pixels each of which is defined by, for example, the corresponding one of the pixel electrodes. As a result, the fixed potential side capacitance electrode is not easily destroyed by a stress developing therein. This is evident from the fact that, assuming an extreme case where the fixed potential side capacitance electrode is formed over the entire surface of the substrate, a very great stress may act inside such a fixed potential side capacitance electrode, to finally damage the fixed potential side capacitance electrode itself or to damage another constituent (for example, the inter-layer insulating film) disposed outside the fixed potential side capacitance electrode. According to this aspect, due to the insular formation of the fixed potential side capacitance electrodes, internal stresses are considered to be deconcentrated more than in such a case, and the damages as stated above can be prevented or substantially prevented from occurring. This merit naturally applies also to a case where the lower light shield films are formed to be insular.

Although the insular formation in each individual pixel unit has been referred to in the above, the present invention is not restricted only to such an aspect. For example, a case may also be covered where two regions having comparatively large areas, such as a left (or upper) half plane and a right (or lower) half plane, are conceptually supposed on the substrate, and where the fixed potential side capacitance electrodes are insularly formed in each of the two regions, that is, a case where the fixed potential side capacitance electrodes are electrically connected within one of the two regions, but where the electrical connections are not made between the another region of the two regions. Needless to say, there are other various methods for forming the fixed potential side capacitance electrodes. In any cases, the functional effects according to this aspect as stated above are correspondingly achieved by such insular formation.

Especially in this aspect, in a case where a plurality of such pixel electrodes exist in the shape of a matrix, positions of peripheral edges of the respective fixed potential side capacitance electrodes or lower light shield films which are insular, should preferably be middle positions of width of the pixel electrodes.

According to such a construction, with the fixed potential side capacitance electrodes taken as an example also here (hereinafter, regarding various aspects about the "insular formation", the "fixed potential side capacitance electrodes" are described as examples), the position of the peripheral edge of each of the fixed potential side capacitance electrodes being insular is set at the middle position of the width of the pixel electrode, in other words, at the middle position of the width of the pixel, so that the formation of the fixed potential side capacitance electrodes, in turn, the formation of the storage capacitors can be performed efficiently.

According to such a construction, the functional effect of the stress deconcentration stated above can be enjoyed more reliably. The reason is explained as below. Since the positions of the peripheral edges of the respective fixed potential side capacitance electrodes being insular are the middle positions of the width of the pixel electrodes, it is generally permitted to bestow substantially the same shapes on all the insular, fixed potential side capacitance electrodes, or to balancedly arrange these electrodes, so that influences which stresses inherent in these electrodes exert on any other constituents disposed outside the electrodes or on the whole electro-optical device can be equalized or balanced. That is, according to this construction, a place where stress concentration is incurred in the extreme does not appear in the electro-optical device, so that the above functional effect can be enjoyed more reliably.

The "middle" in the above "middle position of the width of the pixel electrode" does not signify only the "middle" or "½ of the width of the pixel electrode" in a strict sense. Although such a case is, of course, included, the above functional effect can be achieved substantially similarly even when the peripheral edge lies at, for example, a position which somewhat deviates from, so to speak, such a "true middle position".

In short, the above "middle" signifies an "approximately middle position". In this case, the "approximate" value is concretely determined depending upon the formation aspects or arrangement aspects of the pixel electrodes, the thin film transistors, and the essence of the "approximately middle position" is a mere matter which can be properly determined in design.

In the construction in which the peripheral edge lies at the middle position of the width of each pixel electrode, it is preferable that the data line is extended so as to thread substantially the middle between the adjacent pixel electrodes, and that each of the fixed potential side capacitance electrodes or the lower light shield films being insular has a linearly symmetric shape with respect to the data line when viewed in plan.

According to such a construction, each of the insular, fixed potential side capacitance electrodes has the linearly symmetric shape with respect to the data line when viewed in plan view, so that the layout of the fixed potential side capacitance electrodes having substantially the same and linearly symmetric shapes can be realized over the entire area of the substrate. Thus, even when the electro-optical device according to this construction is adopted for a projector system of multiple-plate scheme where an image is displayed by combining electro-optical devices having liquid crystals of different rotational directions, degradation in an image quality attributed to non-uniform colors is not caused. In consequence of the linearly symmetric formation of the fixed potential side capacitance electrode, the storage capacitor can also be laid out in a pattern linearly symmetric with respect to the data line.

The above "linearly symmetric" shape concretely corresponds to, for example, a letter-T shape or a cruciform shape. The fact of being "linearly symmetric with respect to the data line" corresponds to, for example, a case where the data line coincides with the vertical bar of the letter-T shape, the cruciform shape or the like.

In the aspect where at a minimum, either the fixed potential side capacitance electrode or the lower light shield film is formed to be insular (and in other various aspects), a second contact hole which connects the thin film transistor and the pixel electrode should preferably be further included at a position outside the fixed potential side capacitance electrode or the lower light shield film including the peripheral edge, as viewed from the peripheral edge.

According to such a construction, the above functional effect concerning the stress deconcentration is attained more efficiently. This is based on circumstances as stated below.

In the second contact hole for connecting the thin film transistor and the pixel electrode as in this aspect, the influence of the above stress inherent in the fixed potential side capacitance electrode is usually most liable to occur (that is, the disperse of the stress is most liable to occur). Accordingly, cracks originating from the second contact hole are liable to occur.

In this construction, however, a situation where the influence of the stress is less liable to be exerted on the second contact hole is actualized because the second contact hole as stated above exists at the position outside the fixed potential side capacitance electrode or the lower light shield film as viewed from the peripheral edge. That is, in this construction, it is possible to prevent or substantially prevent the influence exerted by the stress of the capacitive line or the fixed potential side capacitance electrode, concretely, the occurrence of the cracks originating from the second contact hole.

Also, in the aspect where at a minimum, either the fixed potential side capacitance electrode or the lower light shield film is formed to be insular (and in other various aspects), a third contact hole which connects the thin film transistor and the data line should preferably be further included at a position outside the fixed potential side capacitance electrode or the lower light shield film including the peripheral edge, as viewed from the peripheral edge.

According to such a construction, substantially the same functional effect as the functional effect stated about the above construction including the second contact hole is attained.

In another aspect of the electro-optical device of the present invention, the storage capacitor is arranged between the data line and a channel region constituting the thin film transistor, and via inter-layer insulating films relative to the data line and the channel region, respectively.

According to this aspect, a structure in which, for example, the channel region of the thin film transistor, the inter-layer insulating film, the storage capacitor, the inter-layer insulating film and the data line are stacked on the substrate successively from below is supposed. On this occasion, in a case where the data line is formed of a highly reflective film, for example, aluminum film, light reflected from the rear surface of the data line might become stray light to enter the thin film transistor, especially the channel region, as already stated. Since, however, the data line is underlaid with the storage capacitor which consists of the fixed potential side capacitance electrode, dielectric film and pixel potential side capacitance electrode, the light can be intercepted by the storage capacitor. That is, according to this aspect, it is permitted to effectively prevent or substantially prevent the generation of a light leakage current in the thin film transistor.

In another aspect of the electro-optical device of the present invention, the storage capacitor is arranged over the scanning line via an inter-layer insulating film.

According to this aspect, the storage capacitor and the scanning line can be placed over the other when viewed in plan view. Thus, the aperture efficiency can be sharply enhanced, and a sufficient capacitance can be secured for the storage capacitor.

In another aspect of the electro-optical device of the present invention, a drain electrode which is electrically connected to a drain region constituting the thin film transistor is also used as the pixel potential side capacitance electrode constituting the storage capacitor.

According to this aspect, any special material is not separately required to form the pixel potential side capacitance electrode which constitutes the storage capacitor. Accordingly, a manufacturing cost can be curtailed to a corresponding extent.

In another aspect of the electro-optical device of the present invention, the fixed potential side capacitance electrode is made of a material which has a light-shielding property.

According to this aspect, the fixed potential side capacitance electrode comes to have the light-shielding property, so that it can function as an upper light shield film to prevent or substantially prevent the light entrance into the thin film transistor, in addition to the lower light shield film.

Such a material is, for example, the layer already mentioned, made of a metal element, an alloy, a metal silicide or a poly-silicide containing at least one of Al, Ti, Cr, W, Ta and Mo, or the stacked layers including the above layers.

Especially in case of this aspect, the width of the respective electrodes constituting the storage capacitor as extend in the direction of the data line are set to be equal to or larger than the width of the data line, whereby the stray light reflected from the rear surface of the data line can be effectively prevented from illuminating the channel region.

In another aspect of the electro-optical device of the present invention, the lower light shield film is extended under the scanning line and along in a direction the scanning line, while it is protruded in a direction of the data line.

According to this aspect, the arrangement of the lower light shield films can be made to be suitable. Especially, since the lower light shield film according to this aspect is protruded in the direction of the data line, the arrangement of the first contact holes stated above can be suitably determined, and the layout of the whole device can be suitably set.

In another aspect of the electro-optical device of the present invention, the lower light shield films are disposed in a lattice pattern under the scanning lines and the data lines, and along the scanning lines and the data lines.

According to this aspect, the redundancy of the lower light shield films for the fixed potential side capacitance electrodes can be increased more. More specifically, in the case as stated above where the lower light shield film is demonstrating the action of replacing the fixed potential side capacitance electrode or the capacitive line due to the occurrence of cracks or the likes, the functional effect is attained more reliably even when some of the lower light shield films have undergone any faults, for the following reason. Since the lower light shield films are disposed in the lattice pattern under the scanning lines and the data lines and along these scanning lines and data lines, the electric conduction paths thereof exist in large numbers.

In another aspect of the electro-optical device of the present invention, the lower light shield films are connected to a fixed potential source outside an image display area.

According to this aspect, the lower light shield films serve as, so to speak, a pipeline, which feeds a fixed potential to the fixed potential side capacitance electrodes. This is based on nothing but the electrical connections of the lower light shield films with the fixed potential side capacitance electrodes as stated above. According to the structure in which the fixed potential side capacitance electrodes are brought to the fixed potential in this manner, the storage capacitors can be stabilized. In addition, according to the structure in which the lower light shield films are brought to the fixed potential, bad influences, which may be exerted on the thin film transistors by the potential fluctuations of the films, do not need to be substantially dealt with.

The "image display area" signifies a region where light transmission necessary to display an image is actually possible over the substrate. Concretely, it signifies a region which is defined by the existence of the thin film transistors, pixel electrodes, scanning lines, data lines. More concretely or practically, assuming a case where the substrate is overlaid with a light shield film in the shape of a picture frame, the image display area is defined as a region inside the picture frame-shaped light shield film.

Especially in this aspect, the fixed potential source should preferably be constructed of any of a fixed potential source which feeds a fixed potential to a data line drive circuit to drive the data lines, a fixed potential source which feeds a fixed potential to a scanning line drive circuit to drive the scanning lines, and a fixed potential source which feeds a fixed potential to an opposing electrode disposed on an opposing substrate arranged in opposition to the above mentioned substrate.

The several sorts of fixed potential sources according to such constructions are usually required to drive the electro-optical device according to the present invention, so that they are usually disposed in the electro-optical device. In this construction, the fixed potential source to feed the fixed potential to the lower light shield films, in turn, the fixed potential side capacitance electrodes is used in common with any of the several sorts of fixed potential sources stated above.

Thus, according to this construction, any fixed potential source dedicated to the lower light shield films or the fixed potential side capacitance electrodes need not be disposed, so that a manufacturing cost can be curtailed to a corresponding extent, and the structure of the device can be simplified.

A second exemplary embodiment of the electro-optical device of the present invention includes, over a substrate, a scanning line; a data line; a thin film transistor which is disposed in correspondence with an intersection between the scanning line and the data line; a pixel electrode which is disposed in correspondence with the thin film transistor; a pixel potential side capacitance electrode which is electrically connected to the pixel electrode, and which constitutes a storage capacitor; a fixed potential side capacitance electrode which is arranged in opposition to the pixel potential side capacitance electrode via a dielectric film, and which constitutes the storage capacitor; and a lower light shield film which is disposed under the thin film transistor, and which shields, at least a channel region of the thin film transistor from entrance of light. The lower light shield film and the fixed potential side capacitance electrode are electrically connected. The lower light shield film constructs, at least part of a capacitive line for keeping the fixed potential side capacitance electrode at a fixed potential, or a redundant wiring line of the capacitive line. The fixed potential side capacitance electrode is formed to be insular; and the fixed potential side capacitance electrode being insular has an external shape in plan as is defined by a contact hole which electrically connects the data line and a semiconductor layer constituting the thin film transistor and arranged outside the insular electrode, and a contact hole which electrically connects the pixel electrode and the pixel potential side capacitance electrode.

According to the second electro-optical device of the present invention, the fixed potential side capacitance electrode or the capacitance line and the lower light shield film are electrically connected, whereby both are in a redundant relationship, and even when cracks have occurred in the former, the latter can fulfill its function as the fixed potential side capacitance electrode or the capacitive line. Due to the insular formation of such fixed potential side capacitance electrodes, stresses inherent in the fixed potential side capacitance electrodes or capacitive lines can be, so to speak, deconcentrated. Furthermore, the planar external shape of the insular, fixed potential side capacitance electrode is defined by the contact hole being most liable to disperse the stress, and from outside this contact hole, that is, the insular, fixed potential side capacitance electrode does not include the contact hole at the peripheral edge thereof, whereby a situation where the influence of such a stress is less liable to be exerted on the contact hole is actualized, and the cracks originating from the contact hole can be prevented or substantially prevented from occurring.

As a concrete aspect of the fixed potential side capacitance electrodes according to the present invention, assuming by way of example a case where the pixel electrodes are arrayed in the shape of a matrix and where the scanning lines are extended in the row direction of the matrix, while the data lines are extended in the column direction, the contact holes each of which electrically connects the semiconductor layer and the "data line" are made as a series of spots in the column direction. On the other hand, the contact holes each of which electrically connects the pixel electrode and the pixel potential side capacitance electrode can be made as a series of spots along the scanning lines. In such a case, accordingly, the external shape of the insular, fixed potential side capacitance electrode as viewed in plan view can be considered as being defined by two of the contact holes made as series of spots in the column direction and two of the contact holes made as series of spots in the row direction.

In this case, it is further possible to consider such a shape that a part of the fixed potential side capacitance electrode extends in the direction of the scanning line, while another part extends in the direction of the data line. Therefore, the external shape of substantially cruciform shape or substantially letter-T shape can be afforded as the concrete aspect of the insular, fixed potential side capacitance electrode.

An electronic equipment of the present invention includes any of the foregoing electro-optical devices of the present invention (including the various aspects thereof).

According to the electronic equipment of the present invention, in a case, for example, where the fixed potential side capacitance electrode and the lower light shield film are in the redundant relationship as stated above, so even if any fault has occurred in the fixed potential side capacitance electrode, the electro-optical device can continue a device operation without any problem. It is therefore possible to realize various electronic equipment, for example, a liquid crystal projector, a liquid crystal TV receiver, a portable telephone, an electronic notebook, a word processor, a video tape recorder of view finder type or monitor direct view type, a workstation, a video telephone, a POS terminal and a touch panel, for example, the reliability of each of which is generally enhanced.

Such functions and other advantages of the present invention will be clarified from embodiments described below.

DETAILED DESCRIPTION OF PREFERRED EMBODIMENTS

Embodiments of the present invention are described with reference to the drawings. One embodiment explained below is an electro-optical device according to the present invention which is applied to a liquid crystal device.

Figure 1:
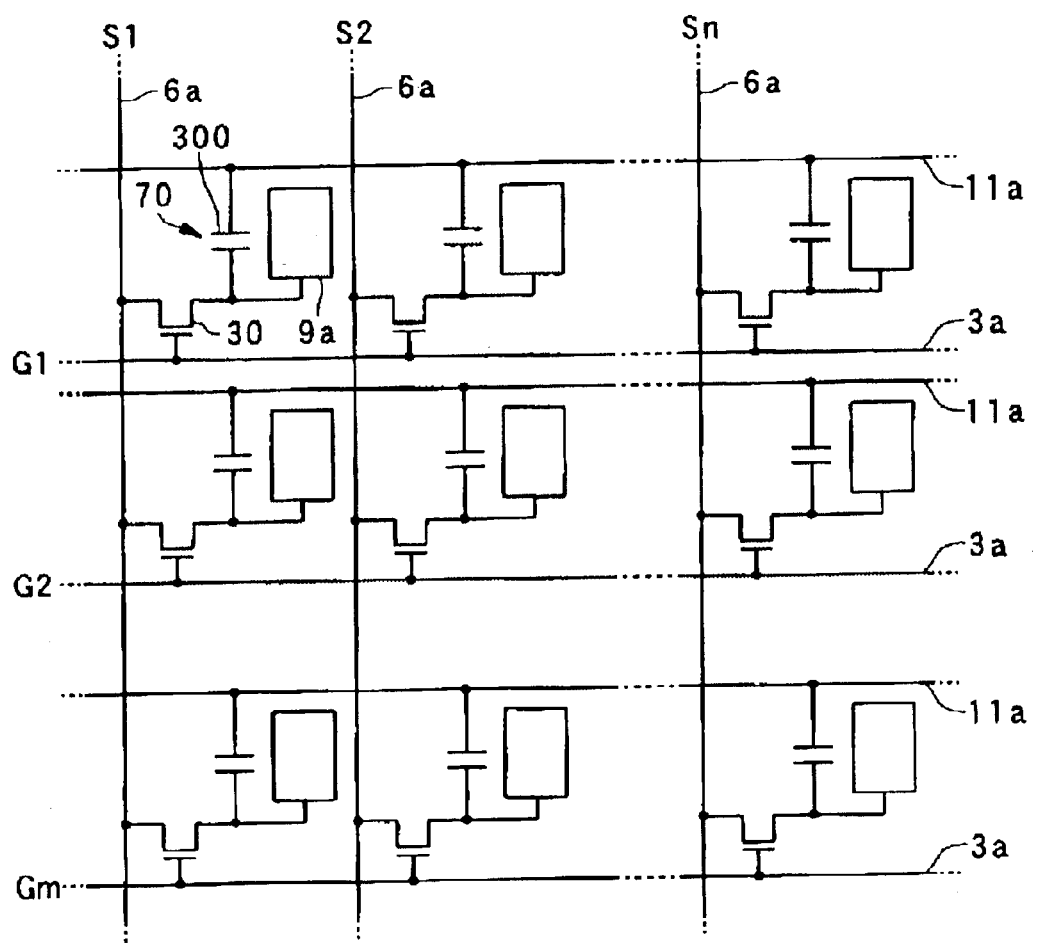
FIG. 1 is a circuit diagram showing an equivalent circuit of several sorts of elements and wiring lines which are disposed for a plurality of pixels arrayed in the shape of a matrix as constitute an image display area in an electro-optical device embodying the present invention.
Figure 2:
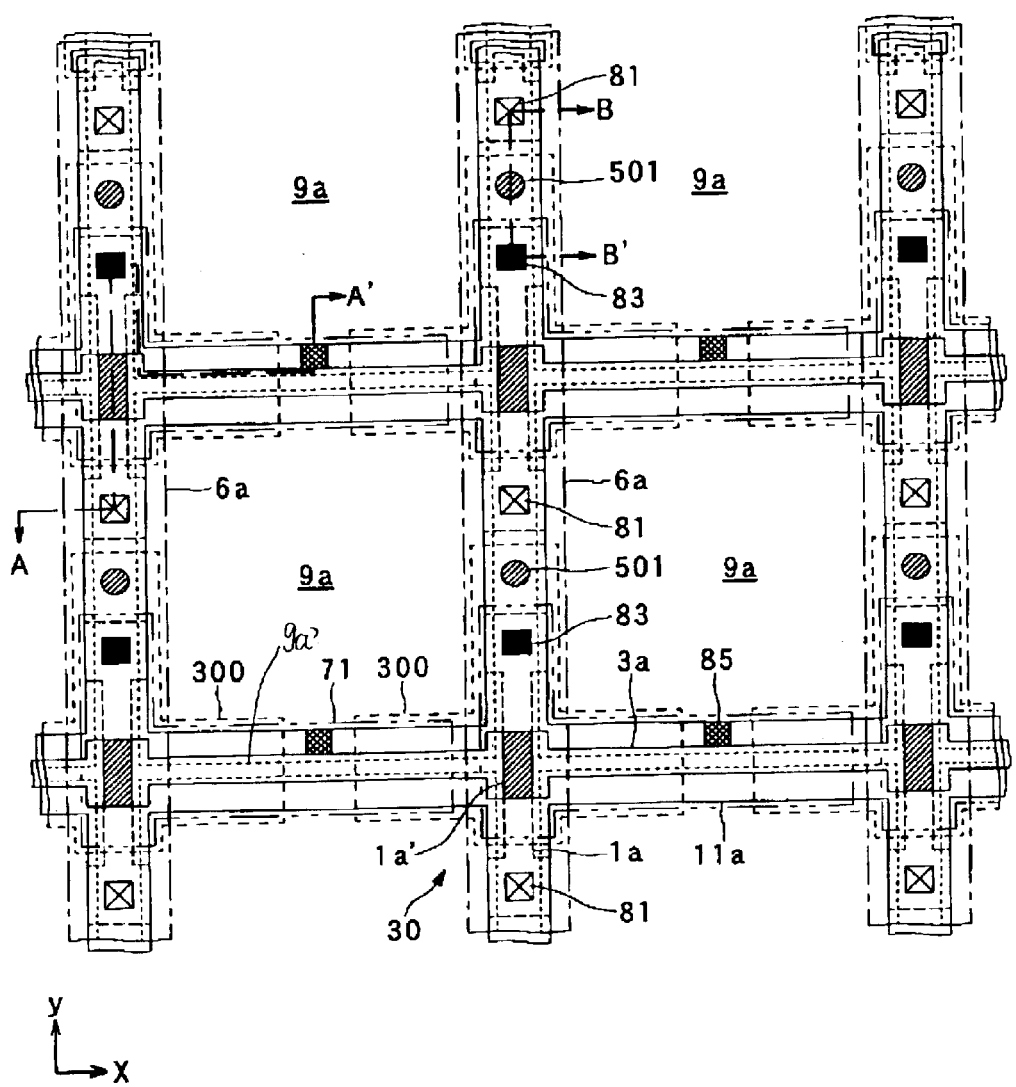
FIG. 2 is a plan view of a plurality of pixel groups adjacent to one another in a TFT array substrate which is formed with data lines, scanning lines, pixel electrodes in the electro-optical device of the embodiment of the present invention.
Figure 3:
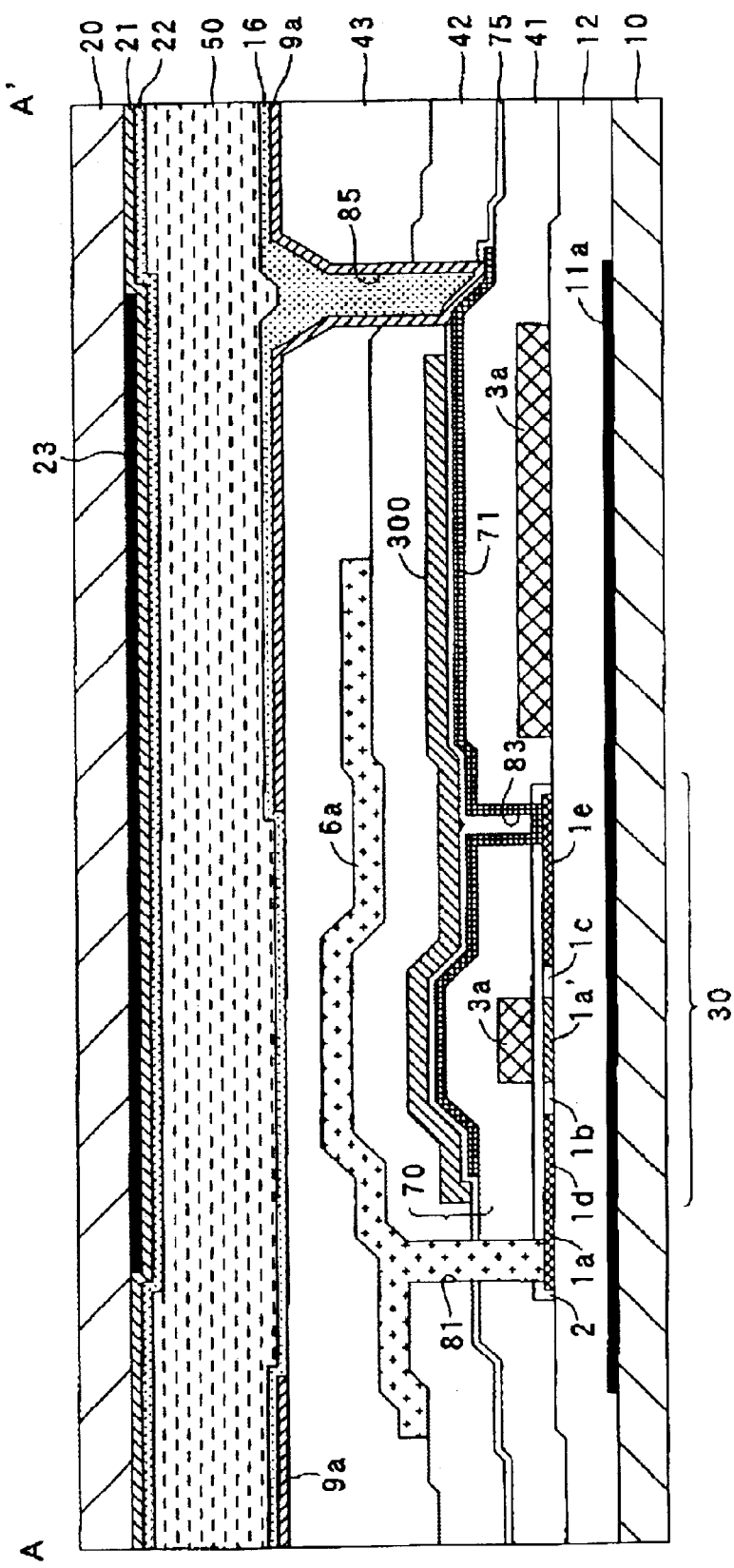
FIG. 3 is a sectional view taken along plane A–A' in FIG. 2.
Figure 4:
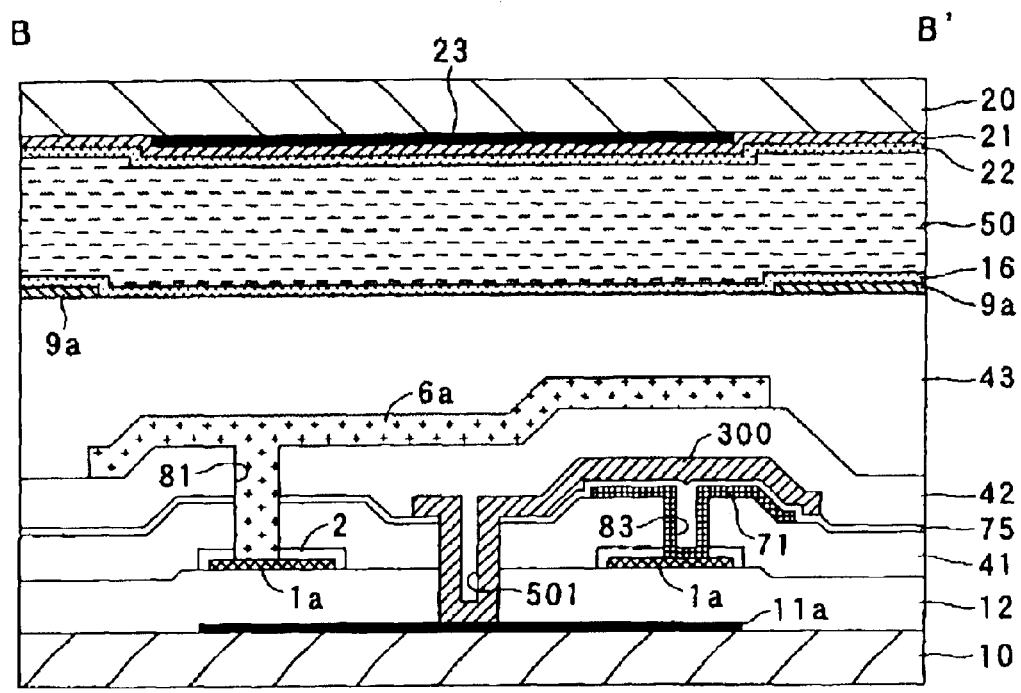
FIG. 4 is a sectional view taken along plane B–B' in FIG. 2.

First, a construction in the pixel section of the electro-optical device in the embodiment of the present invention is described with reference to FIGS. 1 through 4. FIG. 1 shows an equivalent circuit of several sorts of elements and wiring lines in a plurality of pixels which are formed in the shape of a matrix and which constitute the image display area of the electro-optical device. FIG. 2 is a plan view of a plurality of pixel groups adjacent to one another in a TFT array substrate which is formed with data lines, scanning lines, pixel electrodes. FIGS. 3 and 4 are sectional views taken along planes A–A' and B–B', respectively, in FIG. 2. In FIGS. 3 and 4, individual layers and individual members have respectively different reduced scales for the purpose of making them large enough to be recognizable in the drawings.

Referring to FIG. 1, each of a plurality of pixels, which constitute the image display area of the electro-optical device in this embodiment and which are formed in the shape of a matrix, is formed with a pixel electrode 9a, and a TFT 30 for the switching control of the pixel electrode 9a. Each data line 6a which is fed with an image signal, is electrically connected to the sources of the corresponding TFTs 30. Such image signals S1, S2, . . . , and Sn to be written into the data lines 6a may be fed in line sequence in this order, or they may well be fed to the plurality of adjacent data lines 6a group by group.

Each scanning line 3a is electrically connected to the gates of the corresponding TFTs 30, and scanning signals G1, G2, . . . , and Gm are applied to the corresponding scanning lines 3a pulse-wise at predetermined timings and in line sequence in this order. The pixel electrodes 9a are electrically connected to the drains of the corresponding TFTs 30, and they turn ON the TFTs 30 switching elements, for a predetermined time period, whereby the image signals S1, S2, . . . , and Sn fed from the data lines 6a are respectively written at predetermined timings.

The image signals S1, S2, . . . , and Sn of predetermined levels written into a liquid crystal, an example of an electro-optical substance, via the pixel electrodes 9a, are respectively retained between the pixel electrodes 9a and an opposing electrode formed in an opposing substrate, for a predetermined time period. The liquid crystal modulates light and permits a gradation display in such a way that the orientation and order of its molecular aggregate are changed by the applied voltage levels. In a normally-white mode, the transmission factor of the liquid crystal for entered light decreases in accordance with a voltage applied in each individual pixel unit, and in a normally-black mode, the transmission factor of the liquid crystal for entered light increases in accordance with a voltage applied in each individual pixel unit, whereby light which has a contrast conforming to the image signals exits from the electro-optical device as a whole.

In order to prevent or substantially prevent the retained image signal from leaking here, a storage capacitor 70 is added in parallel with a liquid crystal capacitance which is formed between the pixel electrode 9a and the opposing electrode. In FIG. 1, the storage capacitor 70 has a featuring construction in which a fixed potential side capacitance electrode 300 forms one electrode of this storage capacitor 70, while a lower light shield film 11a is electrically connected to the electrode 300, and which is detailed below.

A more practicable construction of the electro-optical device, in which the circuit operations as stated above are implemented by the data lines 6a, the scanning lines 3a, the TFTs 30 is described with reference to FIG. 2 and FIGS. 3 and 4.

First, as shown in FIG. 3 which is the sectional view taken along plane A–A' in FIG. 2, the electro-optical device according to this embodiment includes a TFT array substrate 10 which forms an active matrix substrate, and a transparent opposing substrate 20 which is arranged in opposition to the substrate 10. The TFT array substrate 10 is made of, for example, a quartz substrate, a glass substrate or a silicon substrate, while the opposing substrate 20 is made of, for example, a glass substrate or a quartz substrate.

As shown in FIG. 3, the TFT array substrate 10 is provided with each pixel electrode 9a, which is overlaid with an orientation film 16 subjected to a predetermined orientation process such as rubbing. The pixel electrode 9a is made of a transparent conductive film, for example, ITO (Indium Tin Oxide) film.

On the other hand, the opposing substrate 20 is provided with an opposing electrode 21 over the whole area thereof, and the opposing electrode 21 is underlaid with an orientation film 22 subjected to a predetermined orientation process, such as rubbing. The opposing electrode 21 is made of a transparent conductive film, for example, ITO film. An opposing substrate side light shield film 23 having a lattice pattern is disposed between the opposing substrate 20 and the opposing electrode 21 in order to define open regions (that is, in order to correspond to the pixel electrodes 9a arrayed in the matrix shape (refer to FIG. 2)).

Referring to FIG. 2, the plurality of pixel electrodes 9a (whose contours are indicated by dotted line parts 9a') are disposed in the matrix shape on the TFT array substrate 10 of the electro-optical device, and the data lines 6a and the scanning lines 3a are respectively laid along the vertical and lateral boundaries of the pixel electrodes 9a.

Each scanning line 3a is arranged so as to oppose to those channel regions 1a' of a semiconductor layer 1a which are indicated by regions of right slanting hatches in FIG. 2, and it functions as gate electrodes. That is, the pixel switching TFTs 30 in which the main line parts of each scanning line 3$a$ are arranged as the gate electrodes in opposition to the channel regions 1$a'$ are respectively disposed at the intersection parts between the scanning line 3$a$ and the data lines 6$a$.

As shown in FIG. 3, each TFT 30 has an LDD (Lightly Doped Drain) structure. It is constituted by the scanning line 3$a$ which functions as the gate electrode as stated above, the channel region 1$a'$ of the semiconductor layer 1$a$ which is made of a polysilicon film by way of example and in which a channel is formed by an electric field from the scanning line 3$a$, an insulating film 2 which insulates the scanning line 3$a$ and the semiconductor layer 1$a$ and which includes a gate insulating film, and a lightly-doped source region 1$b$ as well as a lightly-doped drain region 1$c$ and a heavily-doped source region 1$d$ as well as a heavily-doped drain region 1$e$ which are included in the semiconductor layer 1$a$.

Although the TFT 30 should preferably have the LDD structure as shown in FIG. 3, it may well have an offset structure in which no impurities are implanted into the lightly-doped source region 1$b$ and the lightly-doped drain region 1$c$, or it may well be a TFT of self-alignment type in which impurities are implanted at high concentrations by employing each gate electrode formed of part of the scanning line 3$a$, for masks, thereby to form the heavily-doped source region and the heavily-doped drain region in self-alignment fashion. In this embodiment, the pixel switching TFT 30 has a single-gate structure in which only one gate electrode is arranged between the heavily-doped source region 1$d$ and the heavily-doped drain region 1$e$, but two or more gate electrodes may well be arranged between the regions 1$d$ and 1$e$. When the TFT is constructed as a dual gate type or a triple gate type in this manner, leakage currents can be prevented or substantially prevented from flowing through the junctions between the channel and the source and drain regions, and hence, current when the TFT is turned-OFF can be decreased. Further, the semiconductor layer 1$a$ constituting the TFT 30 may be either a non-single-crystal layer or a single-crystal layer. Any related art method, such as sticking, can be employed for the formation of the single-crystal layer. By using the single-crystal layer for the semiconductor layer 1$a$, the performance of each peripheral circuit can be especially heightened.

In FIGS. 3 and 4, the storage capacitor 70 is formed in such a way that a relay layer 71 which is the pixel potential side capacitance electrode connected to the heavily-doped drain region 1$e$ of the TFT 30 and to the pixel electrode 9$a$, and the fixed potential side capacitance electrode 300 (hereinafter "capacitance electrode 300") are arranged in opposition via a dielectric film 75. According to the storage capacitor 70, it is permitted to remarkably enhance potential retention characteristics in the pixel electrode 9$a$.

The relay layer 71 is made of, for example, a conductive polysilicon film, and it functions as the pixel potential side capacitance electrode. The relay layer 71, however, may well be formed of a single-layer film or a multilayer film which contains a metal or an alloy. In addition to the function of the pixel potential side capacitance electrode, the relay layer 71 has the function of relay-connecting the pixel electrode 9$a$ and the heavily-doped drain region 1$e$ of the TFT 30 via contact holes 83 and 85. When such a structure is viewed from another standpoint, it is understood that a drain electrode electrically connected to the heavily-doped drain region 1$e$ is used also as the relay layer 71 or pixel potential side capacitance electrode (refer to FIG. 3).

In this embodiment, accordingly, any special member need not be disposed to form the pixel potential side capacitance electrode, so that a manufacturing cost can be curtailed to a corresponding extent. The utilization of such a relay layer 71 permits a pixel aperture efficiency to be heightened, for the reason that, even when the inter-layer distance between the layers of the pixel electrode 9$a$ and the heavily-doped drain region 1$e$ is as long as about 2000 nm by way of example, both the layers can be favorably connected via the two or more serial contact holes of comparatively small diameters while avoiding the technical difficulty of connecting both the layers via a single contact hole. The relay layer 71 also serves to prevent or substantially prevent etching from punching through at the steps of providing the contact holes.

The dielectric film 75 is a comparatively thin insulating film which is, for example, about 5–200 nm thick, and which contains at least one of $TaO_x$ (tantalum oxide), BST (barium strontium titanate), PZT (lead titanate zirconate), $TiO_2$ (titanium oxide), $ZiO_2$ (zirconium oxide), $HfO_2$ (hafnium oxide), $SiO_2$ (silicon oxide), SiON (silicon oxynitride) and SiN (silicon nitride). Especially with a high permittivity material such as $TaO_x$, BST, PZT, $TiO_2$, $ZiO_2$ or $HfO_2$, a capacitance value can be enlarged in a limited region on the substrate.

Alternatively, with a material containing silicon, such as $SiO_2$, SiON or SiN, the occurrence of stress between the dielectric film 75 and the semiconductor layer 1$a$ and an inter-layer insulating film, such as first inter-layer insulating film 41, which contain silicon, can be lowered.

The dielectric film 75 may well be made of a silicon oxide film, such as HTO (High Temperature Oxide) film, LTO (Low Temperature Oxide) film, or a silicon nitride film. From the viewpoint of enlarging the capacitance of the storage capacitor 70, the dielectric film 75 is better as it is thinner, subject to a satisfactory reliability of this film.

In this embodiment, especially the configuration of the capacitance electrodes 300 has various features. The features are successively explained below.

First, as shown in the plan view of FIG. 2, the capacitance electrodes 300 are formed to be insular in accordance with the dotted distribution of the TFTs 30, that is, the intersection points of the matrix, and the shape of each of them is substantially cruciform.

The capacitance electrode 300 is formed overlying the scanning line 3$a$, in an x-direction in FIG. 2, and it is formed overlying the data line 6$a$, in a y-direction in FIG. 2. In more detail, the x-directional parts of the capacitance electrode 300 overlying the scanning line 3$a$ are formed so as to extend equal lengths with respect to the data line 6$a$, and the y-directional parts thereof overlying the data line 6$a$ are formed so that the upper part in FIG. 2 with respect to the scanning line 3$a$ may become longer than the lower part. In short, the capacitance electrode 300 in this embodiment has a shape which is linearly symmetric with respect to the data line 6$a$.

In this embodiment, the capacitance electrode 300 has the shape as stated above, so that the storage capacitor 70, which is disposed in association with the corresponding pixel electrode 9$a$, has also a shape, which is linearly symmetric with respect to the data line 6$a$. Due to such a shape, the storage capacitor 70 is permitted to have a comparatively large capacitance in spite of being formed by utilizing only the non-open regions. That is, such a storage capacitor 70 is excellent in potential retention characteristics and consequently contributes to the enhancement of an image quality.

As understood from FIG. 2, the peripheral edge of each insular capacitance electrode 300 in the direction of the data line 6a corresponds to a position where a contact hole 81 is formed. More specifically, the insular peripheral edge lies at a somewhat upper position as viewed in the figure, in correspondence with the fact that the contact hole 81 is formed at a somewhat upper position. The contact hole 81 is provided in order to electrically connect the heavily-doped source region 1d of the TFT 30 and the data line 6a as shown in FIG. 3, and it is one example of a "second contact hole" in the present invention.

Regarding the peripheral edge of each capacitance electrode 300 in the direction of the scanning line 3a, the contact hole 85 is formed as shown in FIG. 2. As shown in FIG. 3, the contact hole 85 is provided in order to electrically connect the relay layer 71 and the pixel electrode 9a. Here, the contact hole 85 is one example of a "third contact hole" in the present invention.

In short, in this embodiment, the external shape of the capacitance electrode 300 is such that the peripheral edges of this capacitance electrode 300 lie nearly at the middle positions of the width of each pixel electrode 9a, and that the contact hole 81 for connecting the TFT 30 and the data line 6a, and the contact hole 85 to connect the relay layer 71 and the pixel electrode 9a which are electrically connected to the TFT 30 are provided at the positions outside the capacitance electrode 300 including the peripheral edges, as viewed from these peripheral edges. The expression "width which the pixel electrode 9a has" signifies both the x-directional length and y-directional length of the pixel electrode 9a in FIG. 2.

As clearly shown in FIGS. 3 and 4, the sectional structure of the capacitance electrode 300 as stated above is such that the storage capacitor 70 including the capacitance electrode 300 is disposed so as to overlie the channel region 1a' of the TFT 30 via the first inter-layer insulating film 41 and to underlie the data line 6a via a second inter-layer insulating film 42. That is, the storage capacitor 70 is arranged between the channel region 1a' and the data line 6a, and via the first and second inter-layer insulating films 41 and 42 relative to the first channel region 1a' and the data line 6a, respectively.

Due to such a construction, although it has been apprehended in the related art that light reflected from the rear surface of the data line 6a will become stray light and enter the channel region 1a' of the TFT 30, the stray light is checked from proceeding by the existence of the storage capacitor 70 in this embodiment. According to this embodiment, consequently, light leakage current can be effectively prevented or substantially prevented from being generated in the TFT 30.

In order to effectively fulfill the function as stated above, the capacitance electrode 300 should preferably be made of a material which has a light reflectivity, a light absorbability, or another general light-shielding performance. More concretely, in a case where the electro-optical device is fabricated by, for example, a high-temperature process, the capacitance electrode 300 may be formed of, for example, a layer which is made of a metal element, an alloy, a metal silicide or a poly-silicide containing at least one of refractory metals such as Ti, Cr, W, Ta, Mo and Pd, or stacked layers including the above layers. On the other hand, in a case where the electro-optical device is fabricated by a low-temperature process at or near 400° C., the capacitance electrode 300 may be formed of a layer of Al or the like. The present invention, however, is not restricted to the aspect in which the capacitance electrode 300 is made of such a material, but more generally speaking, the capacitance electrode 300 may be a layer which can function as one electrode of the storage capacitor 70, for example, a conductive layer containing a metal or an alloy.

Especially in the case where the storage capacitor 70 is endowed with the light-shielding function as stated above, the width of the capacitance electrode 300 constituting the storage capacitor 70 and the relay layer 71 being the pixel potential side capacitance electrode, in the direction of the data line 6a, may be set equal to or greater than the width of the data line 6a. Thus, the stray light reflected from the rear surface of the data line 6a can be effectively prevented or substantially prevented from falling on the channel region 1a' of the TFT 30.

Especially in this embodiment, as shown in FIG. 4, the capacitance electrode 300 as stated above is electrically connected with the lower light shield film 11a disposed under the TFT 30, via a contact hole 501 being one example of a "first contact hole" termed in the present invention.

As shown in FIG. 4, the contact hole 501 is provided penetrating the first inter-layer insulating film 41 and a primary insulating film 12 explained below. As shown in FIG. 2, each contact hole 501 is formed at a position nearly corresponding to the peripheral edge of the above capacitance electrode 300 in the direction of the data line 6a, when viewed in plan view. Further, as shown in FIGS. 2 and 4, the contact hole 501 is formed underneath the data line 6a. Thus, the contact hole 501 exists in a non-open region defined by the data line 6a, so that it contributes to more enhancement in the aperture efficiency.

In addition, the contact hole 501 has a substantially cylindrical shape as a whole as shown in FIG. 2, and it differs from the contact holes 81, 83 and 85 whose shapes are substantially square pillars. As explained below, the shape of the contact hole 501 demonstrates the effect of lowering the degree to which stresses inherent in the capacitance electrode 300 affect this contact hole 501. More specifically, if the contact hole 501 had the substantially square shape likewise to each of the contact holes 81, 83 and 85, stress concentrations could occur at the sectional corners of the contact hole 501, but such a concern need not be apprehended in this embodiment.

On the other hand, the lower light shield film 11a is a member, which is disposed under the TFT 30, and which functions to prevent or substantially prevent light from entering this TFT 30. The lower light shield film 11a is extended to outside the image display area in the direction of, at a minimum, the scanning line 3a. On this occasion, the lower light shield film 11a may be protruded in the direction of the data line 6a so as to be electrically connectable with the capacitance electrode 300 via the contact hole 501, underneath this data line 6a. As shown in FIG. 2, such lower light shield films 11a are disposed in a lattice pattern along the scanning lines 3a and the data lines 6a, whereby the lowered resistance and redundant structure of the lower light shield films 11a functioning as capacitive lines can be realized with ease.

The lower light shield film 11a stated above is extended from the image display area 10a where the pixel electrode 9a is arranged, to the surroundings thereof, and it is connected with a constant potential source and is held at a fixed potential. In consequence, the capacitance electrode 300 electrically connected with the lower light shield film 11a is also held at the fixed potential. When the lower light shield film 11a and the capacitance electrode 300 are held at the fixed potential in this manner, it is permitted to prevent or substantially prevent their potential fluctuations from exerting evil effects on the TFT 30, the storage capacitor 70.

The constant potential source for feeding the fixed potential may be the constant potential source of a positive supply voltage or a negative supply voltage which is fed to a data line drive circuit or a scanning line drive circuit explained below, and it may well be a constant potential source which is disposed in order to feed a constant potential to the opposing electrode 21 of the opposing substrate 20. When the constant potential source is shared in this manner, the manufacturing cost of the device can be curtailed to that extent, and also the structure thereof can be simplified.

In this embodiment, the relay layer 71, dielectric film 75 and capacitance electrode 300 are stacked on the TFT array substrate 10 successively from below in the order mentioned, but the present invention is not restricted to such an aspect. Even when the constituents are stacked in the reverse order of the capacitance electrode 300, dielectric film 75 and relay layer 71 by way of example, the functional effects of the present invention are, of course, demonstrated without being subjected to any alteration.

In FIG. 2 and FIGS. 3 and 4, the TFT 30 is underlaid with the primary insulating film 12 as another feature. The primary insulating film 12 has the function of insulating the TFT 30 from the lower light shield film 11a for the inter-layer insulation. Since the primary insulating film 12 is formed over the whole area of the TFT array substrate 10, it has the function of preventing the characteristics of the pixel switching TFT 30 from changing due to the roughness of the TFT array substrate 10 in the surface polishing thereof, the dirt of the TFT array substrate 10 remaining after the wash thereof.

In addition, the scanning line 3a is overlaid with the first inter-layer insulating film 41 in which the contact hole 81 leading to the heavily-doped source region 1d, and the contact hole 83 leading to the heavily-doped drain region 1e are respectively provided.

The primary insulating film 12 and the first inter-layer insulating film 41 are also provided with the contact hole 501 for electrically connecting the lower light shield film 11a and the capacitance electrode 300, as already stated (refer to FIG. 4).

The first inter-layer insulating film 41 is overlaid with the relay layer 71 and the capacitance electrode 300, which are overlaid with the second inter-layer insulating film 42 that is provided with the contact hole 81 leading to the heavily-doped source region 1d, and the contact hole 85 leading to the relay layer 71.

In this embodiment, ions implanted into the polysilicon films which constitute the semiconductor layer 1a and the scanning line 3a may well be activated by subjecting the first inter-layer insulating film 41 to baking at about 1000° C. In contrast, the stresses which appear in and near the interface of the capacitance electrode 300 may well be relieved without subjecting the second inter-layer insulating film 42 to such baking.

The data line 6a is formed on the second inter-layer insulating film 42, and they are overlaid with a third inter-layer insulating film 43 in which the contact hole 85 leading to the relay layer 71 is formed. The upper surface of the third inter-layer insulating film 43 is flattened by CMP (Chemical Mechanical Polishing) or the like, thereby to reduce the orientation defects of a liquid crystal layer 50 attributed to the steps of the wiring lines, the elements underlying this film 43. In lieu of or in addition to such a flattening process of the third inter-layer insulating film 43, however, a flattening process may well be performed in such a way that a trench is dug in at a minimum one of the TFT array substrate 10, primary insulating film 12, first inter-layer insulating film 41 and second inter-layer insulating film 42 so as to bury the wiring lines such as the data line 6a, the TFT 30 therein.

According to the electro-optical device of this embodiment constructed as thus far described, the capacitance electrode 300 as explained above is disposed, so that the following functional effects can be realized.

First, the capacitance electrode 300 and the lower light shield film 11a are electrically connected by the contact hole 501, whereby even when the capacitance electrode 300 has undergone any drawback, its function is redundantly backed-up by the lower light shield film 11a, so that the operation of the whole electro-optical device is not adversely affected. The electrical connection between the capacitance electrode 300 and the lower light shield film 11a permits the fixed potential for the capacitance electrode 300 to be fed via the lower light shield film 11a.

Furthermore, in this embodiment, such an effect can be more reliably enjoyed due to the fact that the lower light shield films 11a are disposed in the lattice pattern. The reason is that a large number of electric conduction paths can be supposed in the lower light shield films 11a disposed in the lattice pattern, whereby even when some of the electric conduction paths have undergone any drawbacks, the flow of currents will be seldom intercepted completely. The present invention, however, is not restricted only to the aspect where the lower light shield films 11a are disposed in the lattice pattern. By way of example, it is also allowed to employ lower light shield films each of which is divided into several parts presenting a substantially cruciform shape so as to conform to the shape of each capacitance electrode 300. Even in such a case, insofar as the individual parts constituting the lower light shield film are connected to the constant potential source, the capacitance electrode 300 electrically connected with the parts can be held at the fixed potential.

In this embodiment, the capacitance electrodes 300 are formed to be insular as shown in FIG. 2, so that the stresses which might appear in the capacitance electrodes 300 can be deconcentrated.

Thus, it is permitted to prevent the damage of each capacitance electrode 300 itself, the breakage of the second inter-layer insulating film 42 attributed to the external actions of the stresses.

Further, in this regard, the above functional effect concerning the stress deconcentration can be more reliably enjoyed for reasons detailed below. In this embodiment, the peripheral edges of the insular capacitance electrodes 300 lie at the middle positions of the width of the pixel electrodes 9a, and the shape of each capacitance electrode 300 is linearly symmetric with respect to the data line 6a, so that even when the stresses act externally, they will act equally within the electro-optical device. Further, the positions of the peripheral edges of each capacitance electrode 300, in other words, the external shape of the capacitance electrode 300 is defined by the contact holes 81 and 85 from outside them, so that the actions of the stresses are less likely to be exerted on the contact holes 81 and 85 which will be liable to the concentrations of the stresses. These functions are conjointly fulfilled. In addition, due to the substantially cylindrical shape of each contact hole 501, the situations of the damage ascribable to the stresses are less prone to occur, as already stated.

Moreover, since the capacitance electrodes 300 redundantly wired by the lower light shield films 11a are formed to be insular, this embodiment brings forth the following functional effects as compared with capacitive lines of fixed potential formed over pixel regions.

When the capacitive line of fixed potential in the related art is made using a refractory metal, such as Cr or W, so as to endure high temperature processing at about 1000° C., a stress appears particularly in an insulating film stacked as an upper layer. The stress is developed due to the difference of coefficients of thermal expansion in the heat-treatment process. When a contact hole is to be formed in the capacitive line of fixed potential, another wiring line near this capacitive line, or the like, the stress is sometimes dispersed to crack the capacitive line or the like. More specifically, when wet etching is performed during the formation of the contact hole, the insulating film cannot endure the stress of the capacitive line on account of the permeation of an etchant in some cases, to incur the crack in the capacitive line. The crack sometimes breaks the capacitive line, or exerts influence on, for example, a gate wiring line near the capacitive line.

When the insulating film is cracked, the crystallinity thereof collapses. In, for example, an insulating film made of an NSG film, a BSG film or a BPSG film, moisture enters the interface of the film, and may lead to lowering the reliability of a transistor.

In contrast, since the fixed potential side capacitance electrodes are formed to be insular in this embodiment, the stresses to be incurred by these electrodes can be lowered to suppress the appearance of the cracks in the capacitive lines and the drawbacks ascribable to the cracks.

In this embodiment, the positions of the peripheral edges of the capacitance electrodes 300 are the middle positions of the width of the pixel electrodes 9a as stated above, and the shape of each capacitance electrode 300 is cruciform, but the present invention is not restricted to such an embodiment.

Figure 5:
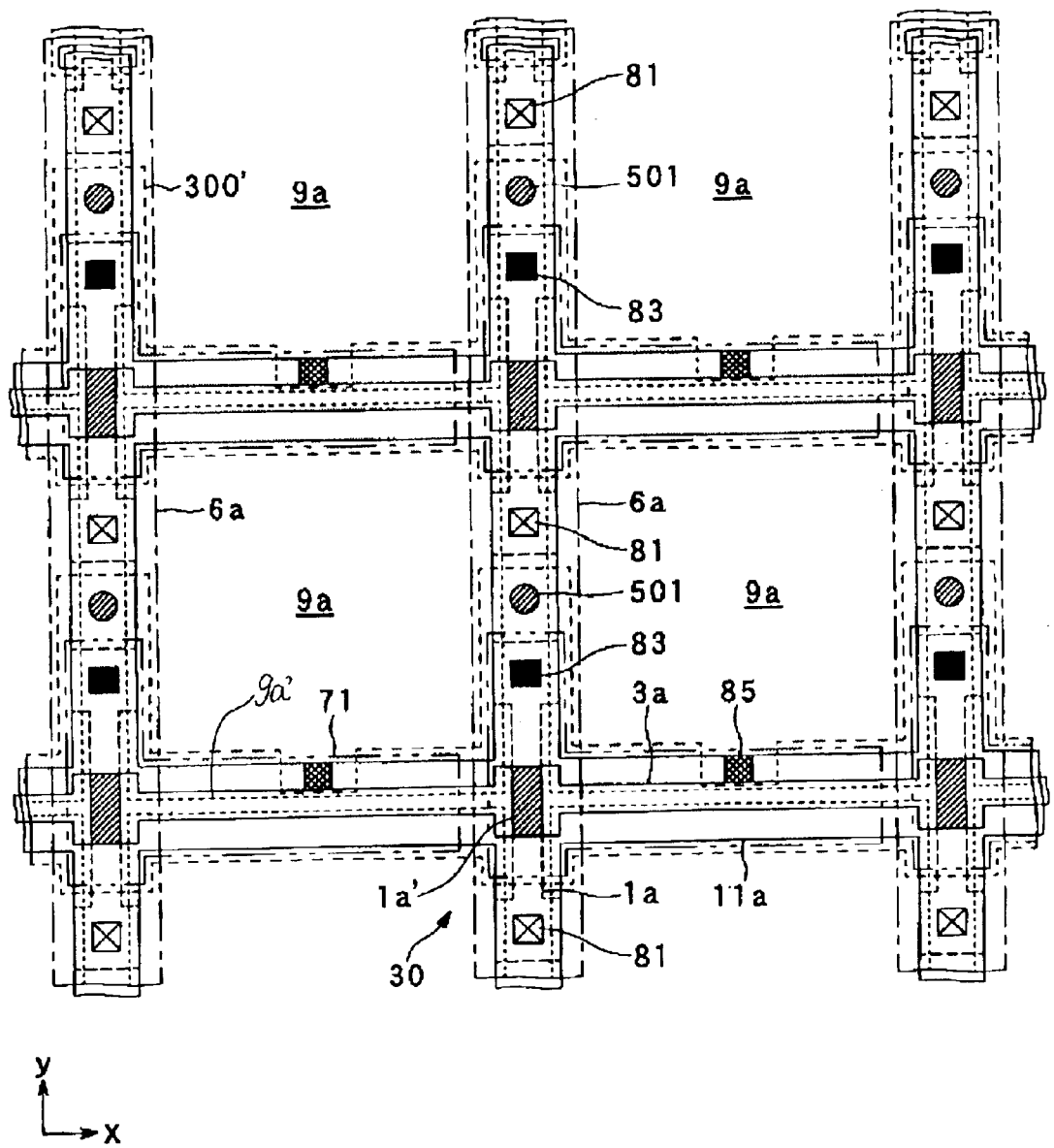
FIG. 5 is a plan view showing an aspect of the formation pattern of a capacitance electrode.
Figure 6:
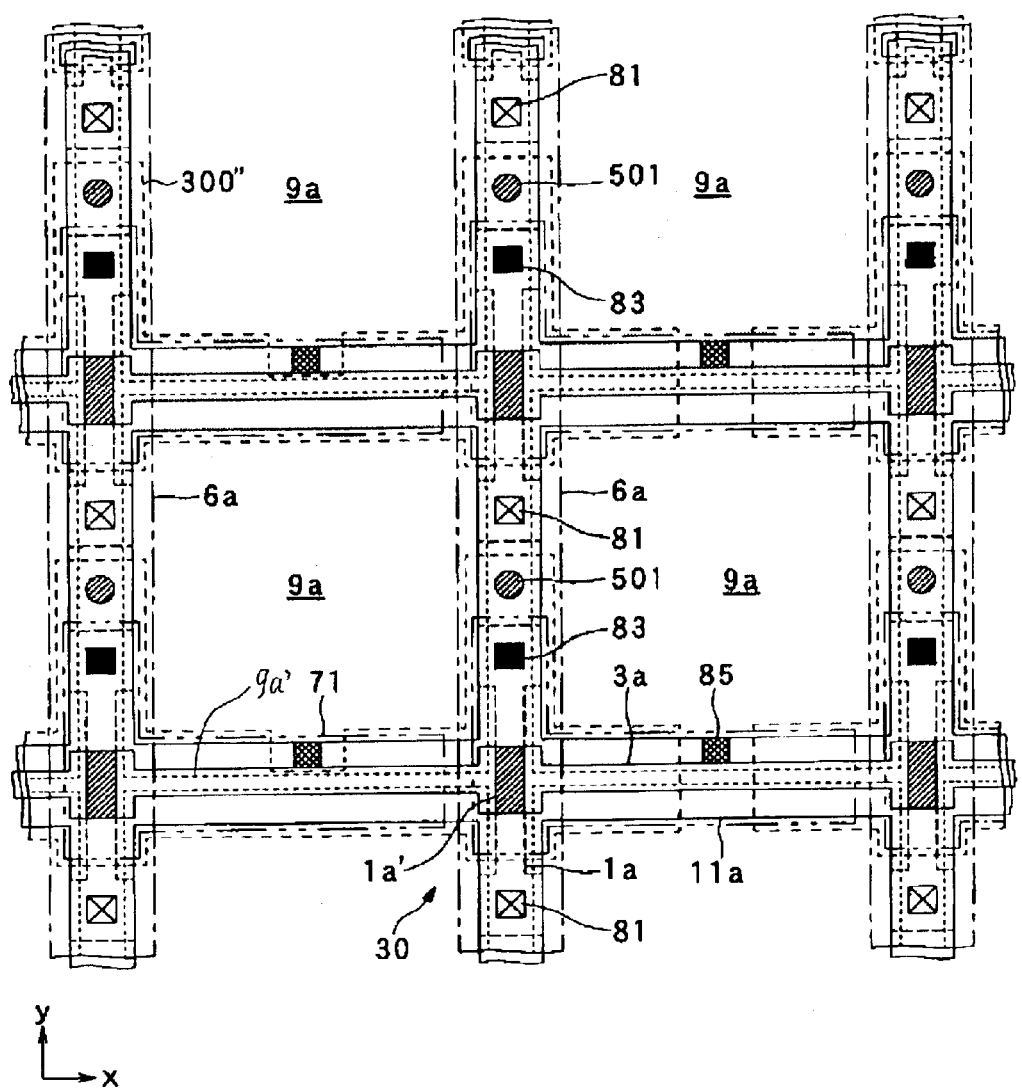
FIG. 6 is a plan view showing another aspect of the formation pattern of a capacitance electrode.

Although other various practicable aspects are considered as such a capacitance electrode, some examples are shown in FIGS. 5 and 6.

First, referring to FIG. 5, a capacitance electrode 300' is in such an aspect that, although it is provided in the direction of the scanning line 3a with constriction portions which avoid the contact holes 85, it is rectilinear unlike the capacitance electrode 300 in FIG. 2. In the direction of the data line 6a, such capacitance electrodes 300' are formed to be insular while avoiding the contact holes 81, likewise to the capacitance electrodes 300 in FIG. 2. That is, in the example of FIG. 5, a plurality of rectilinear capacitance electrodes 300' each extending in the x-direction exist in parallel in the y-direction. In such an aspect, accordingly, the possibility of releasing stresses in the contact holes 81 is lowered.

In the example of FIG. 5, relay layers 71 formed to be insular are arranged in opposition to such capacitance electrodes 300'. In more detail, each of the insular relay layers 71 is shaped so as to consist of a portion which extends in both direction of the data line 6a with respect to the scanning line 3a, and a portion which extends in one direction of the scanning line 3a from the first portion. That is, the relay layer 71 has the shape which is obtained by laying letter-T down sideways. In the example of FIG. 5, that part of the capacitance electrode 300' which functions as a storage capacitor 70 is a part opposing to such a relay layer 71.

Referring to FIG. 6, capacitance electrodes 300" are separated in both directions of the scanning line 3a and the data line 6a and are formed to be insular. The capacitance electrodes 300", however, are not separated in all the separation parts shown in FIG. 2. That is, they are separated, so to speak, every block. In such an aspect, the separation positions are balancedly arranged on the TFT array substrate 10 as in FIG. 2, so that the external actions of stresses ascribable to the capacitance electrodes 300" can be equalized.

In the example of FIG. 6, insular relay layers 71 are also formed as in the example of FIG. 5.

(Whole Construction of Electro-Optical Device)

Figure 7:
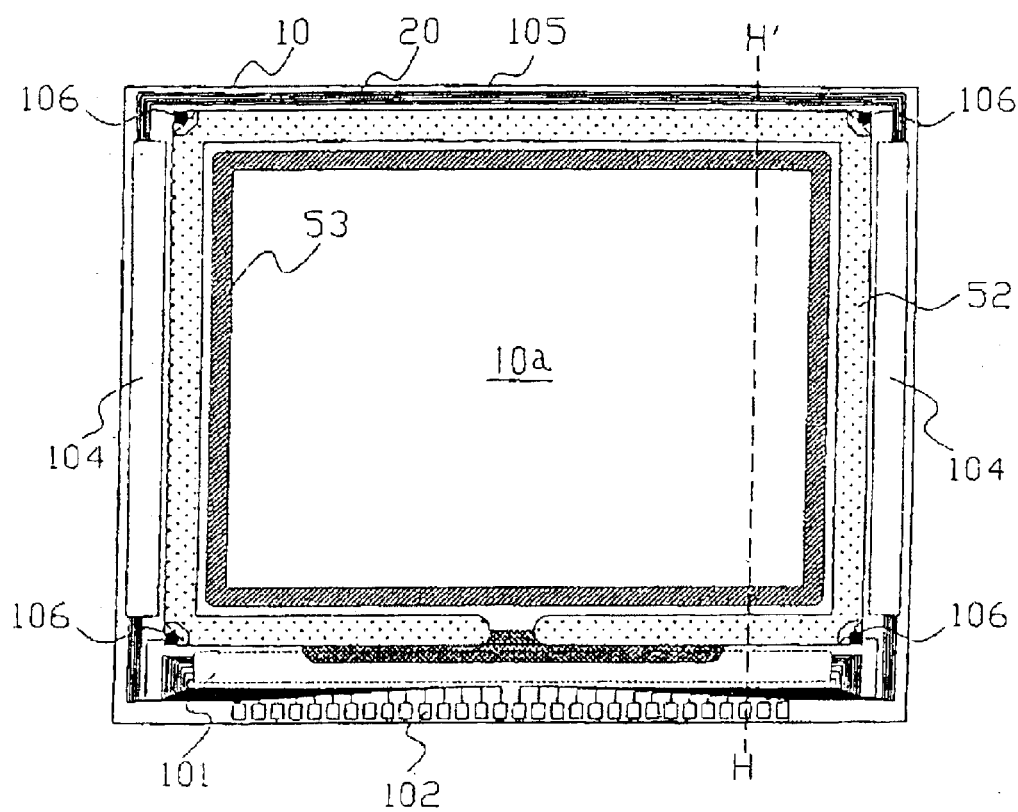
FIG. 7 is a plan view in which a TFT array substrate in an electro-optical device embodying the present invention and various constituents formed thereon are viewed from the side of an opposing substrate.

The whole construction of the electro-optical device according to this embodiment constructed as explained above is described with reference to FIGS. 7 and 8. FIG. 7 is a plan view in which the TFT array substrate 10 and the various constituents formed thereon are seen from the side of the opposing substrate 20, while FIG. 8 is a sectional view taken along plane H–H' in FIG. 7.

Figure 8:
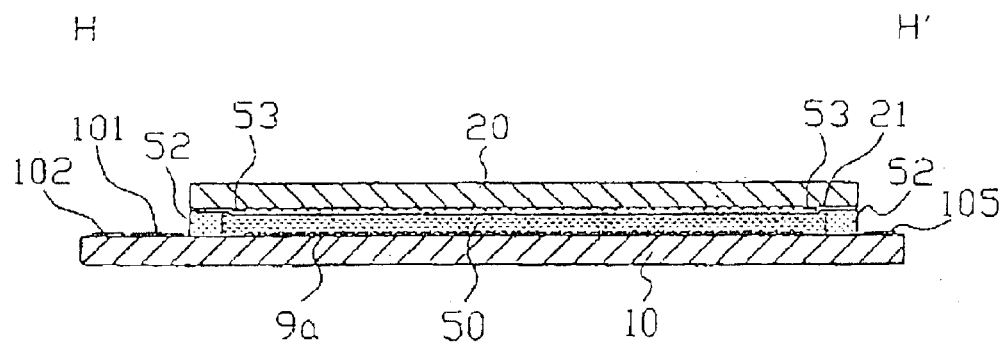
FIG. 8 is a sectional view taken along plane H–H' in FIG. 7.

Referring to FIGS. 7 and 8, in the electro-optical device according to this embodiment, the TFT array substrate 10 and the opposing substrate 20 are arranged in opposition to each other. A liquid crystal layer 50 is enclosed between the TFT array substrate 10 and the opposing substrate 20, which are bonded to each other by a sealant 52 that is disposed in a sealing region located around an image display area 10a.

In order to stick both the substrates together, the sealant 52 is made of, for example, an ultraviolet-hardenable resin or a thermosetting resin, which is hardened by ultraviolet radiation or heating. When the liquid crystal device in this embodiment is a small-sized liquid crystal device which presents an enlarged display as in a projector use, a gap material (spacer) to set the distance between both the substrates (inter-substrate gap) at a predetermined value is dispersed in the sealant 52. Alternatively, when the liquid crystal device is a large-sized liquid crystal device presenting a full-size display, like a liquid crystal display device or a liquid crystal TV, such a gap material may well be contained in the liquid crystal layer 50.

In a region outside the sealant 52, a data line drive circuit 101 to feed image signals to individual data lines 6a at predetermined timings, and external circuit connection terminals 102 are disposed along one side of the TFT array substrate 10, while scanning line drive circuits 104 for feeding scanning signals to scanning lines 3a at predetermined timings are disposed along two sides adjoining the above side.

On condition that the delays of the scanning signals to be fed to the scanning lines 3a are not problematic, the scanning line drive circuit 104 may, of course, be disposed on only one side. The data line drive circuits 101 may well be arrayed on both sides along the image display area 10a.

A plurality of wiring lines 105 to join the scanning line drive circuits 104 disposed on both sides of the image display area 10a are laid along one remaining side of the TFT array substrate 10.

In addition, a conductive material 106 to establish electrical conduction between the TFT array substrate 10 and the opposing substrate 20 is disposed at, at a minimum, one of the corner parts of the opposing substrate 20. As shown in FIG. 8, the opposing substrate 20 which has substantially the same contour as that of the sealant 52 shown in FIG. 7 is secured to the TFT array substrate 10 by this sealant 52.

Referring to FIG. 8, the TFT array substrate 10 is formed with an orientation film on pixel electrodes 9a after pixel switching TFTs and the wiring lines, such as scanning lines and data lines, have been formed. On the other hand, the opposing substrate 20 is overlaid with an opposing electrode 21, and an orientation film as an uppermost layer. The liquid crystal layer 50 is made of a liquid crystal in which one kind or several kinds of nematic liquid crystal/crystals is/are mixed by way of example, and which assumes predetermined orientation states between the pair of orientation films.

The TFT array substrate 10 may well be overlaid with, not only the data line drive circuit 101, scanning line drive circuits 104 but also a sampling circuit which is controlled by the data line drive circuit 101 and which applies phase-expanded image signals to two or more of the data lines 6a at predetermined timings, pre-charge circuits which feed pre-charge signals of predetermined voltage level to the plurality of data lines 6a before the feed of image signals, respectively, an inspection circuit which serves to inspect the quality, defects of the electro-optical device midway of manufacture or at shipment.

(Embodiment of Electronic Equipment)

Figure 9:
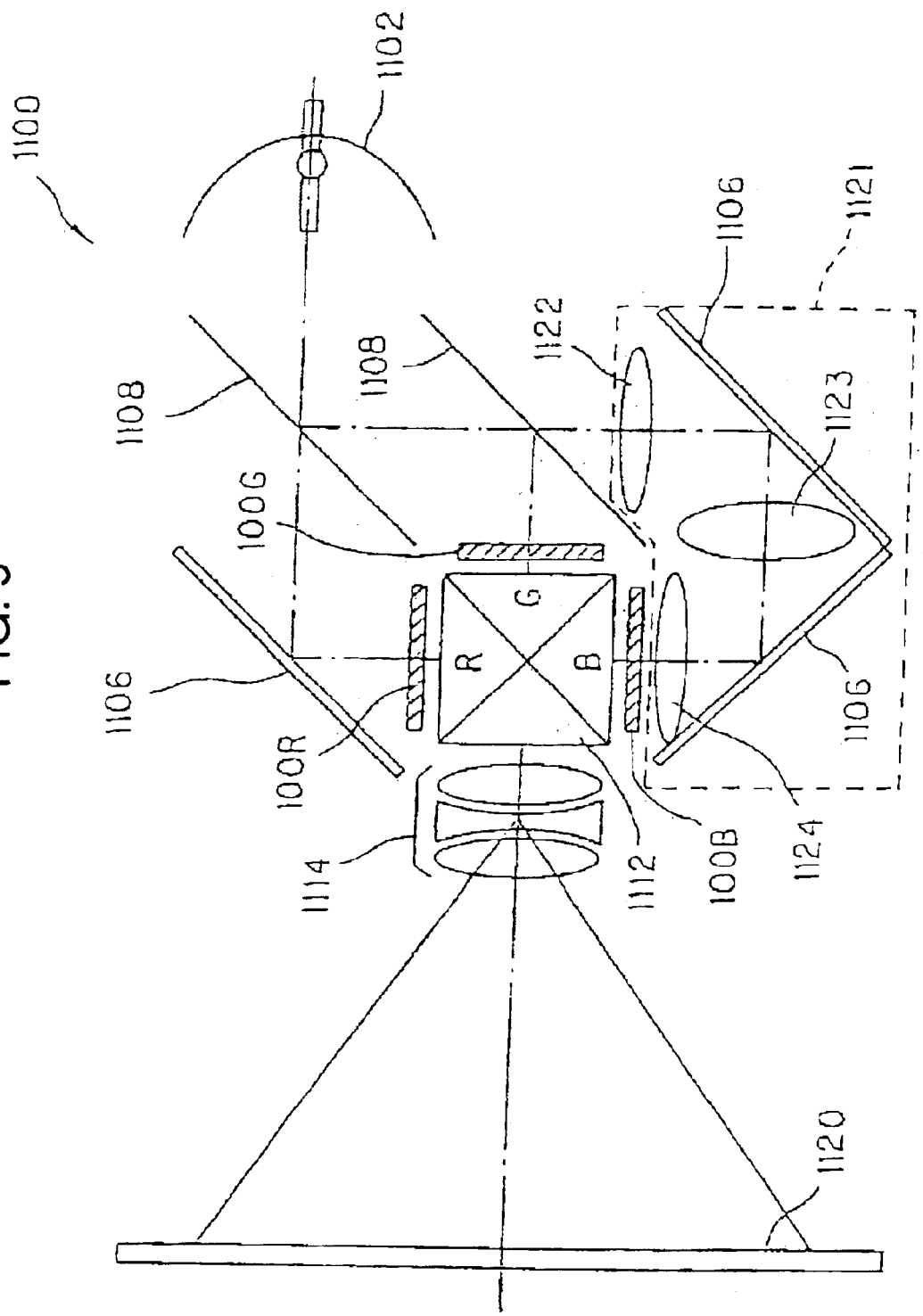
FIG. 9 is a schematic sectional view showing a color liquid-crystal projector which is an example of a projection type color display device in accordance with an exemplary embodiment of an electronic equipment according to the present invention.

Next, an embodiment of a projection type color display device being one example of electronic equipment, in which the electro-optical device explained above in detail is employed as a light valve, will be described concerning the whole construction thereof, particularly the optical construction thereof. FIG. 9 is a schematic sectional view of the projection type color display device.

Referring to FIG. 9, a liquid crystal projector 1100, which is one example of the projection type color display device in this embodiment, is constructed as a projector in which three electro-optical devices each having the drive circuits mounted on the TFT array substrate are prepared and are respectively employed as light valves 100R, 100G and 100B for the three primary colors of RGB. In the liquid crystal projector 1100, when projection light is emitted from a lamp unit 1102 having a white light source, such as metal halide lamp, it is decomposed into light components R, G and B respectively corresponding to the three primary colors RGB, by three mirrors 1106 and two dichroic mirrors 1108, and the light components R, G and B are respectively guided to the light valves 100R, 100G and 100B of the corresponding colors. On this occasion, in order to prevent or substantially prevent a light loss ascribable to a long optical path, the light B is especially guided through a relay lens system 1121 which includes an entrance lens 1122, a relay lens 1123 and an exit lens 1124. Subsequently, the light components corresponding to the three primary colors, respectively modulated by the light valves 100R, 100G and 100B are composed again by a dichroic prism 1112. Thereafter, the resulting composed light is projected as a color image on a screen 1120 through a projection lens assembly 1114.

The present invention is not restricted to the embodiments stated above, but it shall be appropriately alterable within a scope not departing from the purport or idea of the invention read from the claims and the entire specification. The present invention is applicable to electro-optical devices accompanied by such alterations, for example, an electrophoretic device and an electroluminescent display device, and also electronic equipment including the electro-optical devices shall be covered within the technical scope of the present invention.

What is claimed is:

1. An electro-optical device, comprising:
  a substrate;
  a scanning line over the substrate;
  a data line over the substrate;
  a thin film transistor which is disposed in correspondence with an intersection between the scanning line and the data line;
  a pixel electrode which is disposed in correspondence with the thin film transistor;
  a pixel potential side capacitance electrode which is electrically connected to the pixel electrode, and which constitutes a storage capacitor;
  a dielectric film;
  a fixed potential side capacitance electrode which is disposed in opposition to the pixel potential side capacitance electrode via the dielectric film, and which constitutes the storage capacitor; and
  a lower light shield film which is disposed under the thin film transistor, and which shields, at least a channel region of the thin film transistor from entrance of light;
  the lower light shield film and the fixed potential side capacitance electrode being electrically connected;
  the lower light shield film constructing, at least one of a part of a capacitive line to keep the fixed potential side capacitance electrode at a fixed potential, and a redundant wiring line of the capacitive line;
  the lower light shield film and the fixed potential side capacitance electrode being electrically connected by a first contact hole which is provided in an inter-layer insulating film existing between the lower light shield film and the fixed potential side capacitance electrode; and
  the first contact hole being disposed under the data line.

2. The electro-optical device according to claim 1, at least one of the fixed potential side capacitance electrode and the lower light shield film being formed to be insular on the substrate.

3. The electro-optical device according to claim 2, a plurality of the pixel electrodes exists in the shape of a matrix, positions of peripheral edges of the respective fixed potential side capacitance electrodes or lower light shield films which are insular being middle positions of the width of the pixel electrodes.

4. The electro-optical device according to claim 3, the data line being extended so as to thread substantially the middle between the adjacent pixel electrodes, and each of the fixed potential side capacitance electrodes or the lower light shield films that are insular having a linearly symmetric shape with respect to the data line when viewed in plan view.

5. The electro-optical device according to claim 2, further comprising:
  a second contact hole which connects the thin film transistor and the pixel electrode, at a position outside the fixed potential side capacitance electrode or the lower light shield film including the peripheral edge, as viewed from the peripheral edge.

6. The electro-optical device according to claim 2, further comprising:
  a third contact hole which connects the thin film transistor and the data line, at a position outside the fixed potential side capacitance electrode or the lower light shield film including the peripheral edge, as viewed from the peripheral edge.

7. The electro-optical device according to claim 1, the storage capacitor being disposed between the data line and the channel region constituting the thin film transistor, and via inter-layer insulating films relative to the data line and the channel region, respectively.

8. The electro-optical device according to claim 1, the storage capacitor being disposed over the scanning line via an inter-layer insulating film.

9. The electro-optical device according to claim 1,
a drain electrode which is electrically connected to a drain region constituting the thin film transistor also being used as the pixel potential side capacitance electrode constituting the storage capacitor.

10. The electro-optical device according to claim 1,
the fixed potential side capacitance electrode being made of a material which has a light-shielding property.

11. The electro-optical device according to claim 1,
the lower light shield film being extended under the scanning line and along in a direction of the scanning line, while being protruded in a direction of the data line.

12. The electro-optical device according to claim 1,
the lower light shield films being disposed in a lattice pattern under the scanning lines and the data lines, and along the scanning lines and the data lines.

13. The electro-optical device according to claim 1,
the lower light shield films being connected to a fixed potential source outside an image display area.

14. An electro-optical device, comprising:
a substrate;
a scanning line over the substrate;
a data line over the substrate;
a thin film transistor which is disposed in correspondence with an intersection between the scanning line and the data line;
a pixel electrode which is disposed in correspondence with the thin film transistor;
a pixel potential side capacitance electrode which is electrically connected to the pixel electrode, and which constitutes a storage capacitor;
a dielectric film;
a fixed potential side capacitance electrode which is disposed in opposition to the pixel potential side capacitance electrode via the dielectric film, and which constitutes the storage capacitor;
a lower light shield film which is disposed under the thin film transistor, and which shields, at least a channel region of the thin film transistor from entrance of light;
the lower light shield film and the fixed potential side capacitance electrode being electrically connected;
the lower light shield film constructing, at least one of a part of a capacitive line to keep the fixed potential side capacitance electrode at a fixed potential, and a redundant wiring line of the capacitive line;
the lower light shield film being connected to a fixed potential source outside an image display area; and
the fixed potential source is constructed of any of a fixed potential source which feeds a fixed potential to a data line drive circuit to drive the data lines, a fixed potential source which feeds a fixed potential to a scanning line drive circuit to drive the scanning lines, and a fixed potential source which feeds a fixed potential to an opposing electrode disposed on an opposing substrate disposed in opposition to the substrate.

15. An electro-optical device, comprising:
a substrate;
a scanning line over the substrate;
a data line over the substrate;
a thin film transistor which is disposed in correspondence with an intersection between the scanning line and the data line;
a pixel electrode which is disposed in correspondence with the thin film transistor;
a pixel potential side capacitance electrode which is electrically connected to the pixel electrode, and which constitutes a storage capacitor;
a dielectric film;
a fixed potential side capacitance electrode which is disposed in opposition to the pixel potential side capacitance electrode via the dielectric film, and which constitutes the storage capacitor; and
a lower light shield film which is disposed under the thin film transistor, and which shields, at least a channel region of the thin film transistor from entrance of light;
the lower light shield film and the fixed potential side capacitance electrode being electrically connected;
the lower light shield film constructing, at least one of a part of a capacitive line to keep the fixed potential side capacitance electrode at a fixed potential, and a redundant wiring line of the capacitive line;
the lower light shield film and the fixed potential side capacitance electrode being electrically connected by a first contact hole which is provided in an inter-layer insulating film existing between the lower light shield film and the fixed potential side capacitance electrode;
the first contact hole being disposed under the data line;
the fixed potential side capacitance electrode being formed to be insular; and
the fixed potential side capacitance electrode that is insular having an external shape in plan view as is defined by a second contact hole which electrically connects the data line and a semiconductor layer constituting the thin film transistor and disposed outside the fixed potential side capacitance electrode, and a third contact hole which electrically connects the pixel electrode and the pixel potential side capacitance electrode.

16. An electronic equipment, comprising:
an electro-optical device that includes:
a substrate;
a scanning line over the substrate;
a data line over the substrate;
a thin film transistor which is disposed in correspondence with an intersection between the scanning line and the data line;
a pixel electrode which is disposed in correspondence with the thin film transistor;
a pixel potential side capacitance electrode which is electrically connected to the pixel electrode, and which constitutes a storage capacitor;
a dielectric film;
a fixed potential side capacitance electrode which is disposed in opposition to the pixel potential side capacitance electrode via the dielectric film, and which constitutes the storage capacitor; and
a lower light shield film which is disposed under the thin film transistor, and which shields, at least a channel region of the thin film transistor from entrance of light;
the lower light shield film and the fixed potential side capacitance electrode being electrically connected;
the lower light shield film constructs, at least one of a part of a capacitive line to keep the fixed potential side capacitance electrode at a fixed potential, and a redundant wiring line of the capacitive line;
the lower light shield film and the fixed potential side capacitance electrode being electrically connected by a first contact hole which is provided in an inter-layer insulating film existing between the lower light shield film and the fixed potential side capacitance electrode; and the first contact hole being disposed under the data line.

17. An electronic equipment, comprising:
an electro-optical device that includes:
a substrate;
a scanning line over the substrate;
a data line over the substrate;
a thin film transistor which is disposed in correspondence with an intersection between the scanning line and the data line;
a pixel electrode which is disposed in correspondence with the thin film transistor;
a pixel potential side capacitance electrode which is electrically connected to the pixel electrode, and which constitutes a storage capacitor;
a dielectric film;
a fixed potential side capacitance electrode which is disposed in opposition to the pixel potential side capacitance electrode via the dielectric film, and which constitutes the storage capacitor; and
a lower light shield film which is disposed under the thin film transistor, and which shields, at least a channel region of the thin film transistor from entrance of light;
the lower light shield film and the fixed potential side capacitance electrode being electrically connected;
the lower light shield film constructs, at least one of a part of a capacitive line to keep the fixed potential side capacitance electrode at a fixed potential, and a redundant wiring line of the capacitive line;
the lower light shield film and the fixed potential side capacitance electrode being electrically connected by a first contact hole which is provided in an inter-layer insulating film existing between the lower light shield film and the fixed potential side capacitance electrode;
the first contact hole being disposed under the data line;
the fixed potential side capacitance electrode being formed to be insular; and
the fixed potential side capacitance electrode that is insular having an external shape in plan view as is defined by a second contact hole which electrically connects the data line and a semiconductor layer constituting the thin film transistor and disposed outside the fixed potential capacitance electrode, and a third contact hole which electrically connects the pixel electrode and the pixel potential side capacitance electrode.

18. An electro-optical device, comprising:
a substrate;
a scanning line over the substrate;
a data line over the substrate;
a thin film transistor which is disposed in correspondence with an intersection between the scanning line and the data line;
a pixel electrode which is disposed in correspondence with the thin film transistor;
a pixel potential side capacitance electrode which is electrically connected to the pixel electrode, and which constitutes a storage capacitor;
a dielectric film;
a fixed potential side capacitance electrode which is disposed in opposition to the pixel potential side capacitance electrode via the dielectric film, and which constitutes the storage capacitor; and
a lower light shield film which is disposed under the thin film transistor, and which shields, at least a channel region of the thin film transistor from entrance of light;
the lower light shield film and the fixed potential side capacitance electrode being electrically connected;
the lower light shield film constructing, at least one of a part of a capacitive line to keep the fixed potential side capacitance electrode at a fixed potential, and a redundant wiring line of the capacitive line;
the pixel potential side capacitance electrode being disposed over the scanning line via a first inter-layer insulating film;
the fixed potential side capacitance electrode being disposed under the data line via a second inter-layer insulating film;
the lower light shield film and the fixed potential side capacitance electrode being electrically connected by a first contact hole which is provided in an inter-layer insulating film existing between the lower light shield film and the fixed potential side capacitance electrode; and
the first contact hole being disposed under the data line.

19. An electro-optical device, comprising:
a substrate;
a scanning line over the substrate;
a data line over the substrate;
a thin film transistor which is disposed in correspondence with an intersection between the scanning line and the data line;
a pixel electrode which is disposed in correspondence with the thin film transistor;
a pixel potential side capacitance electrode which is electrically connected to the pixel electrode, and which constitutes a storage capacitor;
a dielectric film;
a fixed potential side capacitance electrode which is disposed in opposition to the pixel potential side capacitance electrode via the dielectric film, and which constitutes the storage capacitor; and
a lower light shield film which is disposed under the thin film transistor, and which shields, at least a channel region of the thin film transistor from entrance of light;
the lower light shield film and the fixed potential side capacitance electrode being electrically connected;
the lower light shield film constructing, at least one of a part of a capacitive line to keep the fixed potential side capacitance electrode at a fixed potential, and a redundant wiring line of the capacitive line;
the fixed potential side capacitance electrode being formed to be insular;
the fixed potential side capacitance electrode that is insular having an external shape in plan view as is defined by a first contact hole which electrically connects the data line and a semiconductor layer constituting the thin film transistor and arranged outside the fixed potential side capacitance electrode, and a second contact hole which electrically connects the pixel electrode and the pixel potential side capacitance electrode;
the pixel potential side capacitance electrode being disposed over the scanning line via a first inter-layer insulating film;

the fixed potential side capacitance electrode being disposed under the data line via a second inter-layer insulating film;

the lower light shield film and the fixed potential side capacitance electrode being electrically connected by a first contact hole which is provided in an inter-layer insulating film existing between the lower light shield film and the fixed potential side capacitance electrode; and the first contact hole being disposed under the data line.

* * * * *